United States Patent [19]

Humberstone et al.

[11] Patent Number: 4,786,585
[45] Date of Patent: * Nov. 22, 1988

[54] IMAGE FORMING AND DATA STORAGE

[75] Inventors: Victor C. Humberstone, Stapleford; Robert M. Pettigrew, Foxton, both of England

[73] Assignee: Plasmon Data Systems, Incorporated, Curacao, Netherlands Antilles

[*] Notice: The portion of the term of this patent subsequent to Oct. 7, 2003 has been disclaimed.

[21] Appl. No.: 862,805

[22] Filed: May 13, 1986

Related U.S. Application Data

[63] Continuation of Ser. No. 558,172, Dec. 5, 1983, abandoned.

[30] Foreign Application Priority Data

Dec. 6, 1982 [GB] United Kingdom ............... 8234722

[51] Int. Cl.$^4$ .................. G01D 9/00; G11B 7/24; G03C 1/72
[52] U.S. Cl. .................... 430/495; 430/461; 430/945; 428/900; 346/135.1
[58] Field of Search ............ 346/135.1; 430/495, 430/461; 428/900

[56] References Cited

U.S. PATENT DOCUMENTS

| | | | |
|---|---|---|---|
| 4,238,803 | 12/1980 | Terao et al. | 430/945 |
| 4,266,009 | 5/1981 | Veda et al. | 430/961 |
| 4,359,750 | 11/1982 | Howe | 346/76 L |
| 4,390,600 | 6/1983 | Ohta et al. | 428/900 |
| 4,463,089 | 7/1984 | Bouldin | 346/135.1 |
| 4,480,302 | 10/1984 | Kalk et al. | 346/135.1 |
| 4,499,178 | 2/1985 | Wada et al. | 346/135.1 |
| 4,616,237 | 10/1986 | Pettigrew et al. | 430/495 |

Primary Examiner—Paul R. Michl
Assistant Examiner—Mark R. Buscher
Attorney, Agent, or Firm—Merchant, Gould, Smith, Edell, Welter & Schmidt

[57] ABSTRACT

A method of forming an image and a radiation-sensitive medium suitable for carrying an image is disclosed. The medium comprises a substrate having a surface structure comprising grooves with a depth of 20 to 100 nanometers. At or close to the surface structure there is a layer of radiation-responsive material which is such that irradiation of selected parts of the structure with radiation of a predetermined polarization causes radiation to be absorbed at the irradiated parts of the surface so that corresponding areas of the radiation-responsive layer are affected in a way which makes such areas distinguishable from the remaining, non-irradiated areas of the radiation-responsive layer. An image and/or data may be stored in such a medium in analogue, digital or pictorial form, or in a combination of any two or all three of these forms. The invention also provides primary and secondary pre-formed data carrying media, the secondary media being replicated from the primary media. A primary pre-formed data carrying medium is formed by selectively irradiating a radiation-sensitive medium of the invention so as to form an image representative of a predetermined amount of data.

21 Claims, No Drawings

IMAGE FORMING AND DATA STORAGE

This is a continuation of application Ser. No, 558,172, filed Dec. 5, 1983, now abandoned.

This invention relates to a method of forming an image and data storage using that method, and also to a data storage medium for use in these methods.

According to one aspect of the present invention, there is provided a method of forming an image, which comprises forming a substrate having (1) a surface structure comprising grooves having a depth in the range 20 to 100 nanometers, and (2) at or close to said surface structure, a layer of a radiation-sensitive or radiation-absorptive material; and irradiating selected parts of said surface structure with radiation of a predetermined polarisation, whereby radiation is absorbed at the irradiated parts of the surface so that corresponding areas of the radiation-sensitive or radiation-absorptive layer are affected in a way which makes such areas distinguishable from the remaining areas of the said layer, the radiation-affected parts of said layer thereby constituting an image. For clarification, it is to be noted that the terms "radiation-sensitive" and "radiation-absorptive" as used herein include within their scope "heat-sensitive" and "heat-absorptive". For convenience, the radiation-sensitive or radiation-absorptive layer will be referred to hereinafter as the "radiation-responsive layer" to RRL.

According to a second aspect of the invention, there is provided a method of storing data, which comprises forming an image by the method defined above, the image being arranged to represent the data which is to be stored. The image can represent the data in analogue, digital or pictorial form, for example, or in a combination of any two or all three of these forms.

According to a third aspect of the present invention, there is provided a radiation-sensitive medium comprising a substrate having a surface structure comprising grooves having a depth in the range 20 to 100 nanometers; and at or close to said surface structure, a layer of a radiation-responsive material, said material and the surface structure being such that irradiation of selected parts of said surface structure with radiation of a predetermined polarisation causes radiation to be absorbed at the irradiated parts of the surface so that corresponding areas of the radiation-responsive layer are affected in a way which makes such areas distinguishable from the remaining areas of the radiation-responsive layer.

According to a fourth aspect of the invention, there is provided a primary pre-formed data carrying medium which comprises a substrate having the structure just defined over at least a part of its area, and which has been selectively irradiated so as to carry a predetermined image representative of a predetermined amount of data. According to a fifth aspect of the invention, there is provided a secondary pre-formed data carrying medium which has been replicated from a primary pre-formed data carrying medium as just defined. The technique adopted for replication will depend upon the nature of the initial data-carrying medium and may be, for example, contact printing, moulding, embossing or casting. In such a primary or secondary pre-formed data-carrying medium, the data can be constituted by words, pictures or graphics, or combinations thereof; alternatively or in addition, the data can represent sound patterns such as speech or music.

Preferably, the grooves have a depth in the range 25 to 50 nanometers, more preferably 30 to 40 nanometers.

The spacing or pitch of the grooves will generally be within the range 20 to 1000 nanometers and in most cases will be from 50 to 700 nm.

In many cases, the depth and pitch of the grooves will be constant over all, or at least a substantial part, of the medium. This is not an essential requirement, however, and in some embodiments the pitch and depth of the grooves will vary in a predetermined way across the surface of the medium.

The material of which the RRL is formed can be one in which the desired response to radiation is obtained regardless of the surface structure of the substrate, or one in which the desired response is only obtained when the material is used in conjunction with a suitably configured substrate.

In some embodiments of the invention, the image-carrying medium will have a protective coating layer formed over the image-bearing structure. If the presence of such a coating is ignored, the radiation-responsive layer may constitute the surface layer (i.e. the outermost layer) of the substrate or it may be located a small distance (e.g. in the nanometer range) beneath the surface of the substrate.

The grooves may be in the form of a grating or, if desired, in the form of crossed gratings. The grating(s) can conveniently be sinusoidal or square-wave in section. Alternatively, the surface structure may have a regular array of protuberances between which the grooves are defined.

The material used to form the radiation-responsive layer is preferably such that irradiation of the material causes a small change in the physical or chemical structure of the layer which change can subsequently be detected, e.g. because of a difference in optical properties between those of the original material and those of the radiation-affected material. For example, the RRL can be a magnetic film where absorption of energy raises the temperature of the film to a sufficient temperature, e.g. above its Curie point temperature for a ferromagnetic film, to allow easy poling of magnetisation by application of an external magnetic field. Other magnetic phase changes may also be employed. In another embodiment, the RRL can be a film, e.g. a chalcogenide film, which undergoes an amorphous/crystalline transition when radiation is absorbed.

Alternatively, the radiation-responsive material can be such that absorption of radiation causes local blistering or ablation of the material, thereby producing a gross change in structure of the layer. Such structural changes cause localised changes in the optical properties of the material.

Read out of an image or of recorded information constituting an image will be effected by a technique appropriate to the nature of the RRL and the changes in properties undergone by the RRL in the formation of an image. As an example, the following techniques may be useful: (a) changes in reflectivity of the medium—e.g. where the RRL undergoes blistering or ablation, or where there is a phase change within the RRL; (b) changes in transmissivity—e.g. where the RRL undergoes blistering or ablation; and (c) changes in the response of the medium to polarised light—e.g. where the RRL has undergone a phase change as a result of its irradiation. In some embodiments of the invention, e.g. those where the RRL undergoes a phase change in the selected irradiated areas, the image held by the medium can be erased, e.g. by reversing the phase change.

In one embodiment, the substrate also includes a layer of a magneto-optic material. In such a material, the polarisation vector of a light ray is rotated on its passage through or reflection from the material. Areas of RRL that have been affected by radiation may have a rotation that is different in magnitude or sign from those areas of the RRL that have not been affected by the radiation. The readout from image-carrying areas of the substrate may therefore differ from that from image-free regions of the substrate, so that the image information may be recovered. Thus a substrate formed so as to have a surface structure as described above can be coated with a magneto-optic material to provide a system in which a pre-formed image can be viewed using polarised light.

The substrate used in the various embodiments of the present invention can be formed so that its surface structure as defined above is overcoated with a thin film of a material, for example a metallic material, which is sufficiently thin to be partly transparent to the radiation with which the substrate is intended to be used. Such a superficial layer does not necessarily undergo change when the substrate is irradiated.

In some embodiments, the substrate used in the various aspects of the present invention may be fabricated and/or replicated by the techniques disclosed in European Patent Application No. 83305781.3 or its equivalent, U.S. Pat. No. 4,616,237.

In one embodiment of the present invention, the grooves can be in the form of a surface relief plasmon grating; here, the absorption of radiation is strongly dependent on the wavelength, angle of incidence and polarisation of the radiation and the electromagnetic or optical properties of the RRL. It is believed that when radiation e.g. light which is polarised in the plane of incidence and perpendicular to grooves of the grating is directed onto a plasmon grating, the radiation is very strongly coupled to plasmon oscillations which may decay non-radiatively and give up their energy as heat. This thermal energy then affects the radiation-sensitive layer, providing a very efficient means of impressing image information into the layer and therefore giving high recording sensitivity. Readout from such a grating may also exploit this strong absorption, since the small differences in the electromagnetic or optical properties between those areas carrying image information and those areas not carrying image information may produce marked changes in the nature of the detected readout illumination.

By way of example, with readout from a magneto-optic RRL, the incident illumination may be very strongly absorbed due to the coupling to plasmon oscillations, whilst the polarisation-rotated reflection component is not strongly absorbed. As a result, the output signal (which usually includes a small information carrying signal) is enhanced by virtue of a much reduced background signal. This compares favourably with many systems in which the information-carrying signal is also small, but is superimposed on a very large background.

The conditions required for the coupling of incident radiation to plasmon oscillations are known per se and are described, for example, in "Surface Polaritons", Vol. 1, edited by Agronovich & Maradudin, published by North-Holland, on page 385.

We claim:

1. A method of forming an image, which comprises forming a substrate having (1) a surface structure comprising grooves having a depth in the range 20 to 100 nanometers, and a pitch of 50 to 700 nanometers, and (2) at said surface structure, a layer of a radiation-sensitive or radiation-absorptive material; and irradiating selective parts of said surface structure with radiation of a predetermined polarisation, whereby radiation is absorbed at the irradiated parts of the surface so that corresponding areas of the radiation-sensitive or radiation-absorptive layer are affected in a way which makes such areas distinguishable from the remaining areas of the said layer, the radiation-affected parts of said layer thereby constituting an image.

2. A method of storing data, which comprises forming an image by the method of claim 1, the image being arranged to represent the data which is to be stored in analogue, digital or pictorial form or in a combination of any two or all three thereof.

3. A radiation-sensitive medium comprising a substrate having a surface structure comprising grooves having a depth in the range 20 to 100 nanometers, and a pitch of 20 to 1000 nanometers, and at said surface structure, a layer of a radiation-sensitive or radiation-absorptive material, said material and the surface structure being such that irradiation of a predetermined polarisation causes radiation to be absorbed at the irradiated parts of the surface so that corresponding areas of the radiation-sensitive or radiation-absorptive layer are affected in a way which makes such areas distinguishable from the remaining areas of the radiation-responsive layer.

4. A radiation-sensitive medium comprising a substrate having a surface structure comprising grooves having a degree inn the range 20 to 100 nanometers, and a pitch of 50 to 700 nanometers, and at said surface structure, a layer of a radiation-sensitive or radiation-absorptive material, said material and the surface structure being such that irradiation of a predetermined polarisation causes radiation to be absorbed at the irradiated parts of the surface so that corresponding areas of the radiation-sensitive or radiation-absorptive layer are affected in a way which makes such areas distinguishable from the remaining areas of the radiation-responsive layer.

5. A medium as claimed in claim 4, wherein said grooves have a depth in the range 25 to 50 nanometers.

6. A medium as claimed in claim 4, wherein said grooves have a depth in the range 30 to 40 nanometers.

7. A medium as claimed in claim 4 wherein the depth and pitch of said grooves is constant over all, or at least a substantial part, of the medium.

8. A medium as claimed in claim 4 wherein said grooves are in the form of a grating.

9. A medium as claimed in claim 8, wherein said grating is sinusoidal in section.

10. A medium as claimed in claim 4 wherein said grooves are in the form of cross-gratings.

11. A medium as claimed in claim 4 wherein said grooves are defined by a regular array of protuberances.

12. A medium as claimed in claim 4 wherein the radiation-sensitive or radiation-absorptive layer comprises a magnetic film which is such that absorption of radiative energy raises the temperature of the magnetic film to a temperature sufficient to allow poling of magnetisation by application of an external magnetic field.

13. A medium as claimed in claim 4 wherein the radiation-sensitive or radiation-absorptive layer is a film which undergoes an amorphous/crystalline transition when radiation is absorbed.

14. A medium as claimed in claim 13, wherein said film is a chalcogenide film.

15. A medium as claimed in claim 4 wherein the radiation-sensitive or radiation-absorptive material is such that absorption of radiation causes local blistering or ablation of the material.

16. A medium as claimed in claim 4 wherein the medium is overcoated with a thin film of a material which is sufficiently thin to be transparent to the radiation with which the medium is intended to be used.

17. A medium as claimed in claim 16, wherein said thin film of overcoating material is a thin film of a metallic material.

18. A medium as claimed in claim 4 wherein the substrate comprises a layer of a magneto-optic material.

19. A primary pre-formed data carrying medium which comprises a medium as claimed in claim 4 which has been selectively irradiated so as to carry a predetermined image representative of a predetermined amount of data.

20. A secondary pre-formed data carrying medium characterised in that it has been replicated from a primary pre-formed data carrying medium as claimed in claim 19.

21. A radiation-sensitive medium comprising a substrate having a surface structure comprising grooves of generally sinusoidal cross-section having a peak to trough depth in the range 20 to 100 nanometers and a pitch in the range 50 to 700 nanometers; overlying said surface structure, a thin film of a radiation-sensitive or radiation-absorptive material; and overcoating said radiation-sensitive or radiation-absorptive material, a thin film of a metallic material, said radiation-sensitive or radiation-absorptive material and the surface structure being such that irradiation of selected parts of said surface structure with radiation of a predetermined polarisation causes radiation to be absorbed at the irradiated part of the surface so that corresponding areas of the radiation-sensitive or radiation-absorptive layer are affected in a way which makes such areas distinguishable from the remaining areas of the radiation-responsive layer.

* * * * *

UNITED STATES PATENT AND TRADEMARK OFFICE
CERTIFICATE OF CORRECTION

PATENT NO. : 4,786,585

DATED : November 22, 1988

INVENTOR(S) : V. C. Humberstone, et al

It is certified that error appears in the above-identified patent and that said Letters Patent is hereby corrected as shown below:

Column 4, line 33, claim 4, "degree" should be --depth--;

Column 4, line 33, claim 4, "inn" should be --in--

Column 4, line 57, claim 10, "cross-gratings" should be --crossed gratings--.

Signed and Sealed this

Thirtieth Day of May, 1989

Attest:

DONALD J. QUIGG

Attesting Officer

Commissioner of Patents and Trademarks